United States Patent [19]

Beldyk et al.

[11] Patent Number: 5,042,655
[45] Date of Patent: Aug. 27, 1991

[54] PELLICLE PACKAGING AND HANDLING SYSTEM

[75] Inventors: David A. Beldyk, Poughkeepsie, N.Y.; Cramer C. Hegeman, Danbury, Conn.

[73] Assignee: E. I. Du Pont de Nemours & Co., Wilmington, Del.

[21] Appl. No.: 413,352

[22] Filed: Sep. 27, 1989

[51] Int. Cl.$^5$ .................................. B65D 85/38
[52] U.S. Cl. ........................ 206/316.1; 206/454; 206/493; 206/460
[58] Field of Search ............... 206/316.10, 460, 334, 206/328, 454, 455, 449, 555, 480, 477, 493, 301

[56] References Cited

U.S. PATENT DOCUMENTS

| | | | |
|---|---|---|---|
| 3,489,265 | 1/1970 | Puente | 206/454 |
| 3,532,213 | 10/1970 | Schulz | 206/316.1 |
| 3,615,006 | 10/1971 | Freed | 206/328 X |
| 4,470,508 | 9/1984 | Yen | 206/334 |
| 4,549,843 | 10/1985 | Jagusch et al. | 206/334 X |
| 4,697,701 | 10/1987 | Ying | 206/316.1 |
| 4,776,462 | 10/1988 | Kosugi et al. | 206/334 |
| 4,830,182 | 5/1989 | Nakazato et al. | 206/328 X |
| 4,842,136 | 6/1989 | Nakazato et al. | 206/334 X |

Primary Examiner—Jimmy G. Foster
Assistant Examiner—Jacob K. Ackun, Jr.

[57] ABSTRACT

A pellicle packaging and handling system include a pellicle having a transparent pellicle film extending across a peripheral pellicle frame. A pellicle holder releasably grips the pellicle frame to form a holder/pellicle assembly, the pellicle holder being graspable to handle the holder/pellicle assembly and release the pellicle from the holder. The selectively openable enclosure houses the holder/pellicle assembly with the holder/pellicle assembly releasably retained in a fixed position within the enclosure.

17 Claims, 6 Drawing Sheets

PELLICLE PACKAGING AND HANDLING SYSTEM

BACKGROUND OF THE INVENTION

1. Field of the Invention

The present invention relates to the field of packaging and handling systems for the shipment, storage and handling of pellicles that are used for covering pattern masks during the manufacture of integrated circuits.

2. Description of the Background Art

Integrated circuits typically are manufactured in processes that utilize pattern mask imaging. When these processes involve projection printing of the pattern mask images, ultraviolet light is passed through the apertures of the pattern mask and is focused on a layer of resist that is coated on a substrate wafer. The light forms a pattern in the layer of resist that corresponds to the pattern mask, and the layer of resist is then developed to expose portions of the substrate to form a photoresist mask. Because the image of the pattern mask is brought into sharp focus on the photoresist layer surface, any contaminating particles present on the surface of the pattern mask are also brought into sharp focus on the surface of the photoresist layer, causing undesirable printing on the contaminating particle images in the resist layer. Printing of contaminating particle images on the photoresist layer often renders the photoresist mask useless, resulting in considerable economic waste.

To reduce the risk of particulate contamination of pattern masks, protective pellicles are generally used to cover the mask. Pattern mask pellicles include a transparent pellicle film that extends across a pellicle frame, and are mounted over respective patterns masks by a pellicle mounting device. The pellicle frame separates the pellicle film from the pattern mask by a distance sufficient to keep the images of contaminating particles that are located on the outer surface of the pellicle out of focus, so that the images of the contaminating particles will not be printed with the circuit pattern on the light sensitive layer of resist.

While a pellicle will prevent focusing of contaminating particles on the outer surface of the pellicle, contaminating particles within the interior of pellicle that fall onto the pattern mask will print out with the pattern and may render the resulting photoresist mask useless. Although pellicles can be manufactured essentially particle-free, subsequent packaging, shipment, storage and handling can cause particulate contamination of the interior of the pellicle.

One method for preventing particulate contamination of the interior of a pellicle during Packaging, shipment and storage, is to seal the pellicle along the lower edge of the pellicle frame with a complementarily shaped backseal sheet that is peeled away shortly before the pellicle is mounted over the pattern mask.

Pellicles typically are removed from their packaging with gloved hands, and the potential exists that the interior of a pellicle can become contaminated with particles during removal of a backseal sheet, and prior to mounting the pellicle over the pattern mask. Also, pellicles typically are quite awkward to hold with the hand. There thus is a risk that the pellicle will be dropped during handling prior to mounting, and the pellicle thereby contaminated or even damaged.

There remains a need for improved systems for packaging and handling pellicles.

SUMMARY OF THE INVENTION

In accordance with the present invention, a pellicle packaging and handling system comprises a pattern mask pellicle that includes a transparent pellicle film extending across a peripheral pellicle frame. A pellicle holder is provided having means for releasably attaching the pellicle frame to form a holder/pellicle assembly, the pellicle holder further including means for grasping and handling the holder/ pellicle assembly and for releasing the pellicle from the holder. A selectively openable enclosure is provided for housing the holder/pellicle assembly, and means for releasably retaining the holder/ pellicle assembly in a fixed position within the enclosure are provided.

DETAILED DESCRIPTION OF THE PREFERRED EMBODIMENTS

Figure 1:
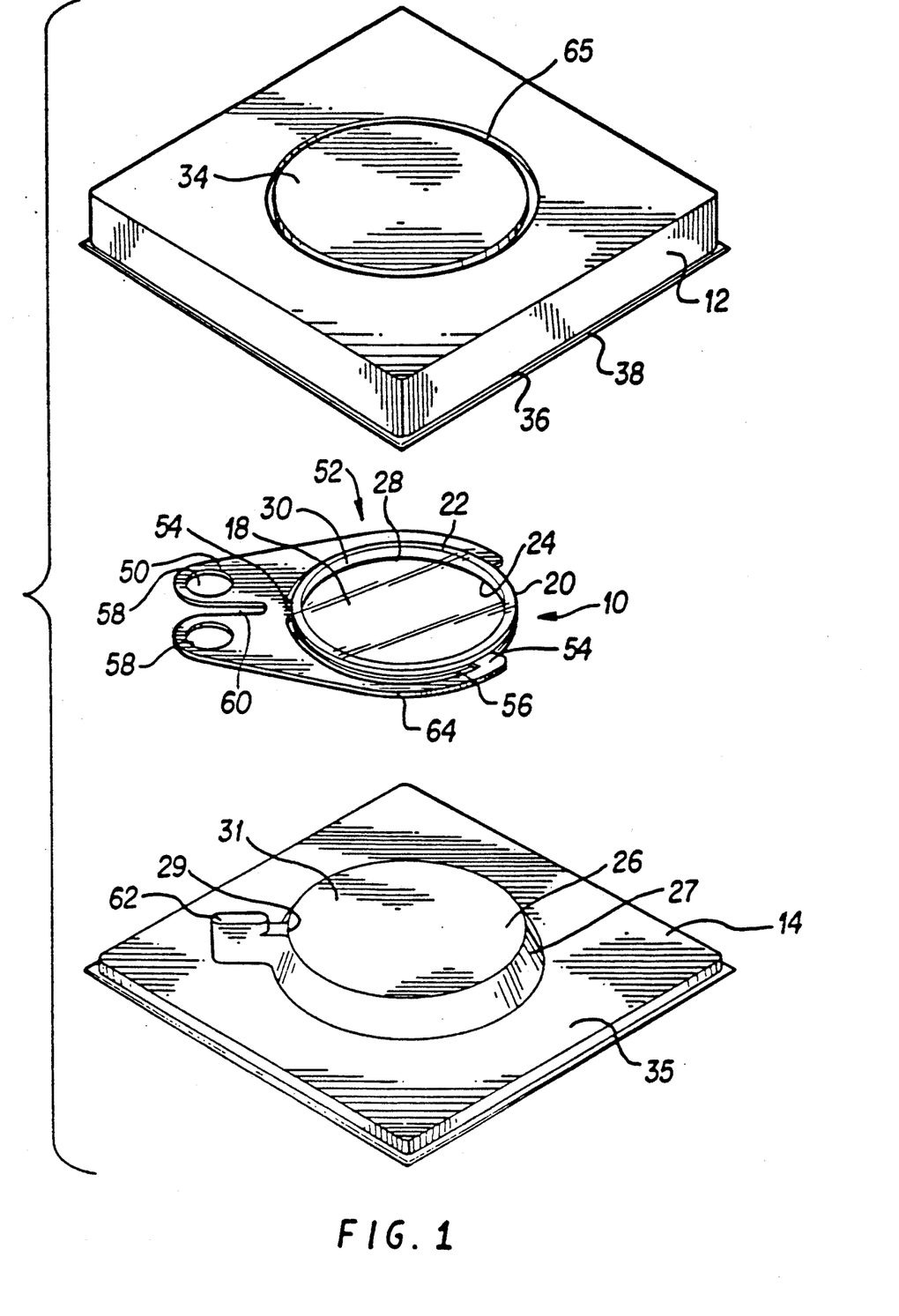
FIG. 1 is a perspective, partly exploded view of a pellicle packaging and handling system according to one embodiment of the present invention with a squeeze-to-release pellicle holder.

With reference to FIG. 1, one embodiment of a pellicle packaging and handling system according to the present invention including a pattern mask pellicle 10 housed within a pellicle Package or box formed by a box top member 12 and a box bottom member 14.

The pellicle 10 includes a transparent pellicle film 18 extending across a peripheral pellicle frame 20. The pellicle frame 20 is formed of any suitably strong materials, such as machined metal (e.g., aluminum), and typically has a shape and size corresponding to the pattern mask with which it is to be used. For example, the pellicle frame can be circular, angular (e.g., rectangular), have one or more truncated ends, and/or one or more truncated corners. The transparent pellicle film 18 usually is attached to the top edge 22 of the pellicle frame by means of an adhesive.

The transparent pellicle film can be formed of any suitable material, and should be of a thickness such that it does not adversely affect the optical path of the image-forming ultraviolet light. Suitable pellicle film materials include polymers such as polyoxyethylene terephthalate, nitrocellulose and parylene. For such pellicle film materials, film thicknesses within the range of about 0.2–10 microns are suitable. If desired, antireflective coatings can be applied to the film to reduce optical distortion.

The peripheral pellicle frame 20 has a continuous sealing edge 24 around bottom portion of the pellicle frame. Because the sealing edge of the pellicle frame is intended to be applied over a pattern mask to cover the pattern mask with the pellicle film 18, the sealing edge 24 of the pellicle frame lies in a plane that is parallel with the pellicle film and spaced away from the pellicle film a distance sufficient to maintain the images of any particles on the outer surface of pellicle film 18 out of focus during printing. In use, the sealing edge 24 of the pellicle frame generally positions the transparent film from about 1 to about 15 millimeters from the mask pattern, thereby maintaining particles on the outer surface of the transparent film 18 out of focus.

A box bottom member 14 is provided, having a contact surface 26 that is peelably adhered to the sealing edge 24 is around the bottom of pellicle frame 20. The contact surface 26 of box bottom member 14 is on a raised stage area 27, the purpose of which will be discussed in detail below.

A variety of means are suitable for peelably adhering the contact surface 26 of box bottom member 14 to the sealing edge 24 of pellicle frame 20. In the embodiment shown in FIG. 1, the sealing edge of the pellicle frame is formed by the bottom surface of a resilient foam gasket carrier 28, the top surface of which is fixedly attached to a rigid frame element 30 of pellicle frame 20. Suitably resilient foam gasket adhesive materials include, but are not limited to 3M No. 4962 and Norwood No. 8031. Pressure sensitive adhesive material applied to the bottom sealing edge portion of gasket 28 is peelably adhered to the box bottom member 14, thereby hermetically sealing the interior 16 of the pellicle. Suitable pressure sensitive adhesives include, but are not limited to, Gelva ™ multipolymer resins (e.g., Nos. 1151 and 3010) manufactured by Monsanto.

There are other means besides a resilient gasket 28 with adhesive that are available for peelably adhering the pellicle frame to the contact surface of the box bottom member. Other suitable means include double-sided tape placed between the pellicle frame 20 and the contact surface 26 of box bottom 14, or an adhesive sheet 29 over the entire upper surface 31 of the raised stage 27 to which the sealing edge of the pellicle frame is adhered. One advantage to providing adhesive over the entire upper surface 31 of stage 27 is that particles trapped within the interior of pellicle 10 can be captured and retained by the exposed adhesive surface is such particles come into contact with the adhesive surface. Suitable adhesives for covering the entire upper surface of raised stage 27 retain their structural integrity during the life of the package so that the adhesive itself will not form contaminating particles.

The box bottom member 14 carrying pellicle 10 extends outwardly beyond the raised stage 27 to form a peripheral flange 35 around the raised stage. In the embodiment shown, the box bottom member 14 is formed of a one-piece, flexible sheet that can be manufactured by any suitable method, including extrusion, injection molding, blow molding, vacuum forming, machining, and the like.

A pellicle packaging and handling system according to the present invention includes a pellicle holder 50 that is provided with means for releasably gripping the pellicle frame to form a holder/pellicle assembly 52. In the embodiment shown in FIG. 1, the means for releasably gripping the pellicle frame include a plurality of inwardly extending tabs 54 that engage a complementary beeper depression such as groove 56 around the outer perimeter of pellicle frame 20. In the embodiment shown in FIG. 1, the peripheral groove 56 extends around the entire pellicle frame 20. Tabs 54 extend inwardly from a pair of opposed pivotable arms 64 that extend symmetrically at least part way around pellicle frame 20. Instead of tabs, the pellicle frame can include pins that fit within corresponding recessed holds in the pellicle frame, in the manner of a mortise and tenon.

The pellicle holder 50 includes means for grasping and handling the holder/pellicle assembly 52 and for releasing the pellicle 10 from holder 50. In the embodiment shown in FIG. 1, these means include finger grip means 58 for grasping the holder/pellicle assembly. When grasping the finger grip means 58, the box bottom member 14 can be peelably separated from the sealing edge 24 around the bottom of pellicle frame 20, and the holder/pellicle assembly can be easily handled after separation from box bottom 14. When desired, pellicle 10 can be easily released from holder 50 by simply squeezing together finger grip means 58. In the embodiment shown in FIG. 1, the raised stage area 27 of box bottom member 14 provides sufficient space for insertion of a user's fingers within the finger grip means 58, for gaining control of pellicle holder 50.

The "squeeze-to-release" pellicle holder shown in FIG. 1 is formed in one piece of a resilient material that provides spring action to bias tabs 54 inwardly into grooves 56 of pellicle frame 20, to securely hold the pellicle within the pellicle holder until the finger grip means 58 are squeezed to release the pellicle.

Pellicle holder 50 includes a slot 60 that not only allows movement of finger grip means 58 towards each other to release pellicle 10, but also engages a complementary stop 62 extending upwardly from a box bottom member 14 above raised stage 27, to prevent rotation of the pellicle holder until the holder/pellicle assembly is removed from the packaging by the user.

A means for grasping and handling the holder/pellicle assembly and for releasing the pellicle from the holder need not be finger grip means, but instead could be means graspable by a mechanical device for placing the pellicle holder on the pellicle mounter, or it could even be means graspable by the pellicle mounter itself for removing the holder/pellicle assembly from the packaging, mounting the pellicle over the pattern mask and thereafter releasing the pellicle from the holder.

A box top member 12, together with the box bottom member 14, form an enclosure that houses holder/pellicle assembly 52. Box top member cover 12 includes a body portion 34 for covering pellicle 10, and downwardly extending holder-seating ring member 65 that presses against arms 64 of the pellicle holder when the box is closed.

In the embodiment shown in FIG. 1, box top member 12 further includes sealing zone 36 that is located on the bottom side of an outwardly extending lip 38 round the periphery of the pellicle body portion 34.

The peripherical sealing zone 36 of lip 38 is peelably adhered to the peripheral flange 35 of the package bottom plate 14 to enclose and hermetically seal the pellicle 10 within the pellicle cover 12 and the package bottom plate 14.

The pellicle cover is peelably adhered to the peripheral flange of the package bottom plate by any suitable means, such as those mentioned above in connection with adhering the sealing edge of the pellicle frame to the package bottom plate. These means included solid adhesive applied to the contacting regions of the sealing zone 36, double-sided tape and the like.

A wide variety of materials are suitable for the box top and bottom members of the pellicle holder. The particular material or materials utilized to form these packaging and handling components will depend upon the cost of materials, and the various advantages and disadvantages of the inherent properties and characteristics of the materials. The materials utilized for the packaging and handling components must be generally non-particulating and capable of being cleaned. Because of this, high carbon content plastics, though good for static charge dissipation, usually are not desirable from a particle generation standpoint. After manufacture, the packaging and handling components are cleaned prior to assembly. Typically, the packaging and handling components are cleaned in aqueous solutions, alcohol, freon or other solvents, and the packaging material must be able to withstand the cleaning solvent used.

Suitable materials for the packaging and handling components are sufficiently strong to protect the pellicle from impact and other abuse during shipping and storage in the case of the box top and bottom members, and sufficiently resilient in the case of the pellicle holder to allow releasable gripping and control of the pellicle. The materials preferably do not become brittle at low temperatures. Advantageously, the packaging and handling materials are lightweight to reduce the shipping costs. Suitable thicknesses for the packaging and handling components generally fall within the range of 0.5–3 mm.

The pellicle packaging and handling of materials should not absorb appreciable amounts of moisture from the atmosphere, since this may damage the pellicles. Also, the packaging and handling material should have the ability to dissipate electrical charge. Metal is ideal for dissipating electrical charge, but is undesirable for the box top and bottom members because of weight, corrosion, expense and the like. Other candidates are low particle generating carbon filled plastics, metallized plastics, and plastics with anti-static coatings or additives. If anti-static coatings or additives are used, such should be capable of withstanding the cleaning process and not be susceptible to outgassing. Outgassing can damage the pellicle, and cause discoloration and increased opacity in transparent packaging. Although discoloration and increased opacity are generally not functional problems by themselves, they often are indicative of an outgassing problem.

Examples of materials suitable for forming the pellicle packaging and handling components are listed in Table 1 below:

TABLE 1

| MATERIAL | WATER ABSOR. (%) | FLEX MOD. ($10^5$ PSI) | FLEX STR. (KPSI) | IMPACT STR. (FT-LB/IN) |
| --- | --- | --- | --- | --- |
| Polyethylene Terephthalate (PET) | 08–.09 | 2.8–4.0 | 12–14 | .5 |
| High Impact Polystyrene | .05–.06 | 1.5–4.6 | 3–12 | .5–4.0 |
| Polycarbonate | .15 | 3.0–3.4 | 11–15 | 12–16 |
| Acrylics | .3 | .65–2.5 | 7–10.5 | .6–1.2 |

Figures 2, 3:
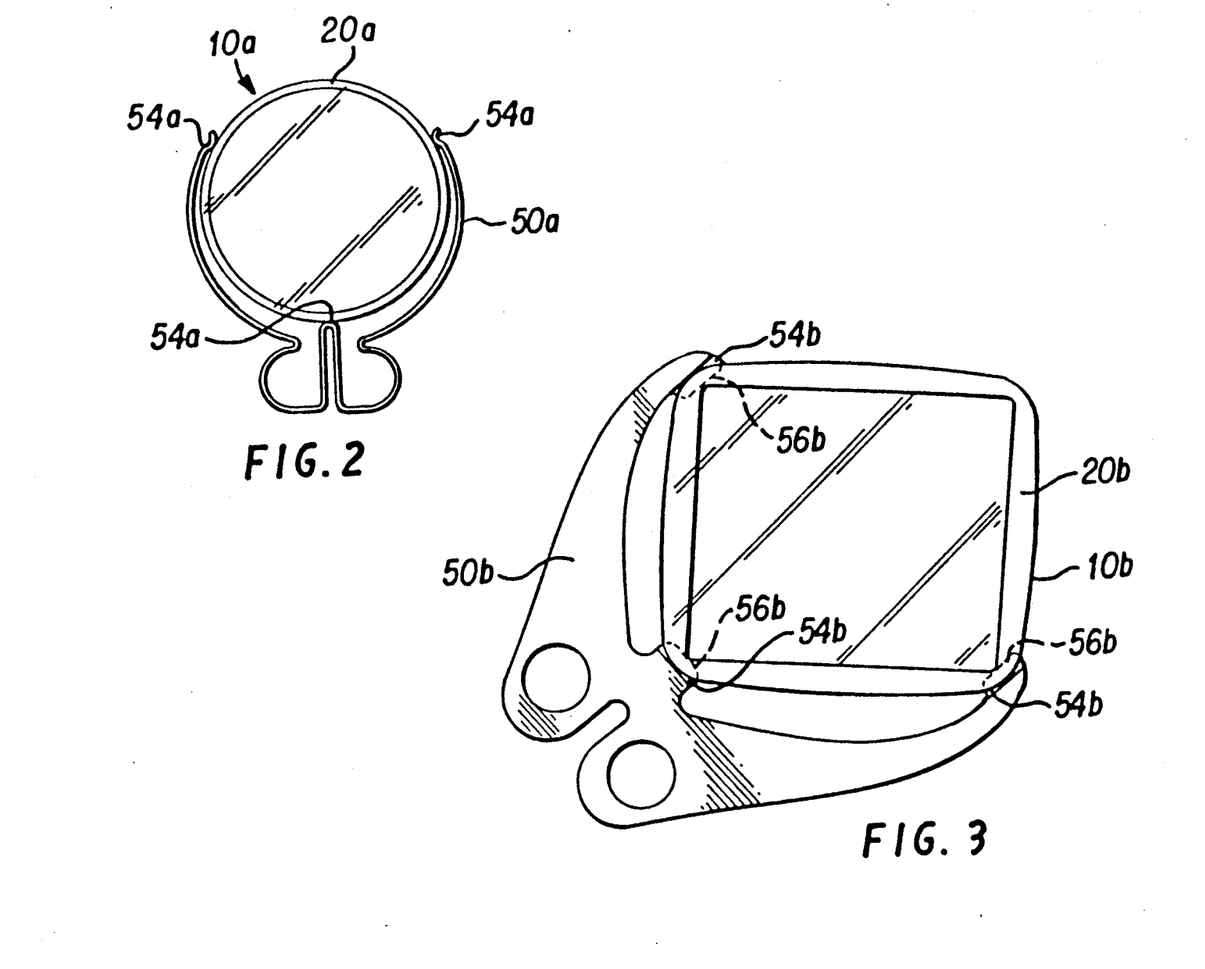
FIG. 2 is an elevational view of a holder/ pellicle assembly according to the present invention with a spring wire squeeze-to-release pellicle holder.
FIG. 3 is an elevation view of a holder/ pellicle assembly according to yet another embodiment of the present invention, with a squeeze-to-release pellicle holder.

The holder/pellicle assembly shown in FIG. 2 has a squeeze-to-release pellicle holder 50a formed of spring wire. The spring wire pellicle holder 58 includes tabs 54a that fit within a V-shaped groove within pellicle frame 20a of pellicle 10a.

FIG. 3. illustrates a holder/pellicle assembly with a squeeze-to-release pellicle 50b holding a rectangular pellicle 10b. Pellicle holder 50b includes tabs 54b that fit within corner grooves 56b in pellicle frame 20b.

Figure 4A:
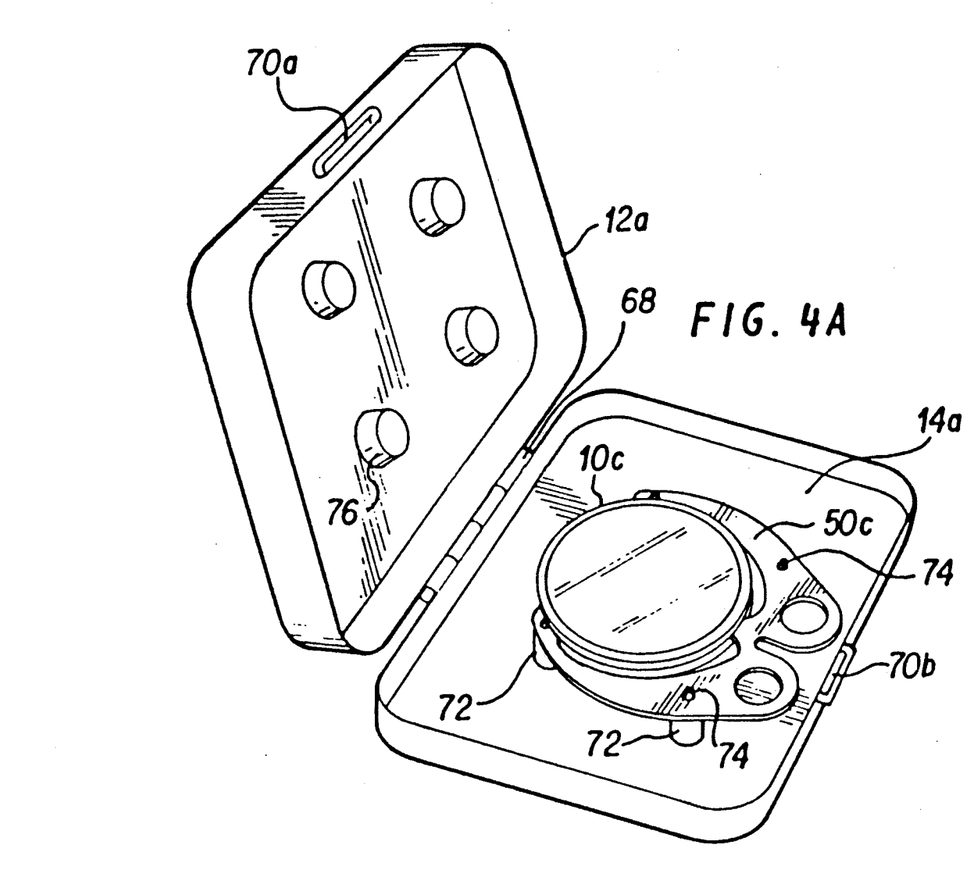
FIG. 4A is a perspective view of a pellicle packaging and handling system having a squeeze-to-release pellicle holder and hinged pellicle packaging shown open.
Figure 4B:
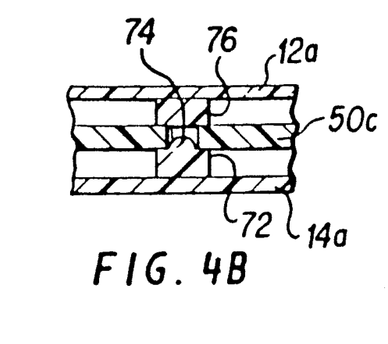
FIG. 4B is a cross-sectional view showing details of the pellicle supporting means of the system shown in FIG. 4A.

FIGS. 4 and 4B show a hinged enclosure for housing a holder/pellicle assembly in accordance with another embodiment of the present invention. The packaging system includes a box top member 12a connected to a box bottom member 14a by a hinge 68. Latch means 70a and 70b renders the enclosure selectively openable and closeable.

A squeeze-to-release pellicle holder 50c holding pellicle 10c rests on four first land members 72 extending upwardly from the box bottom 14a. Each of the first land members 72 includes centrally located upwardly extending pins 74 that extend into corresponding apertures in pellicle holder 50c. When the pellicle box is closed, pellicle holder 50c is held between the first land member 72 and corresponding second land members 76 extending downwardly from the box top 12a, with pins 74 within the corresponding apertures in pellicle holder 50c. Thus, in this embodiment the pellicle box supports and retains the pellicle holder 50c and the holder 50c supports and retains pellicle 10c without any contact between pellicle 10c and the pellicle box.

Figure 5:
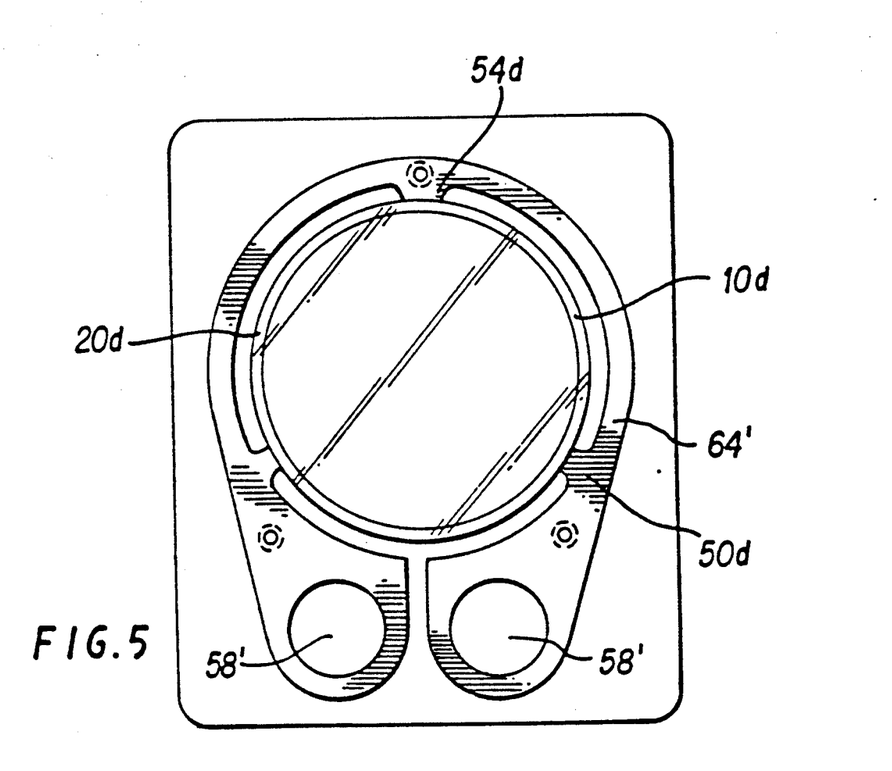
FIG. 5 is a top elevational view of a pellicle packaging and handling system according to another embodiment of the invention with a squeeze-to-grip pellicle holder.
Figure 6:
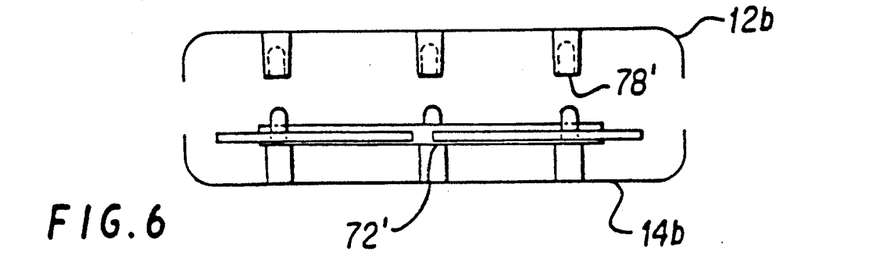
FIG. 6 is a side elevation view, partly exploded and with portions broken away, of the pellicles packaging and handling system shown in FIG. 5.

FIGS. 5 and 6 illustrate a pellicle packaging and handling system according to yet another embodiment of the present invention. According to this embodiment, a squeeze-to-grip pellicle holder 50d is provided. The finger grip means 58' are located at the end of arms 64' that extend almost entirely around pellicle frame 20d of pellicle 10d. As in the prior embodiments, tabs 54d engage a peripheral slot around the outer perimeter of pellicle frame 20d. In the embodiment shown, the pellicle holder 50d rests on three first land members 72' extending upwardly from land member 72' into corresponding apertures in pellicle holder 50d. The pellicle holder is held between land members 72' and the second land members 78' extending downwardly from the box top member 12b.

Figure 7:
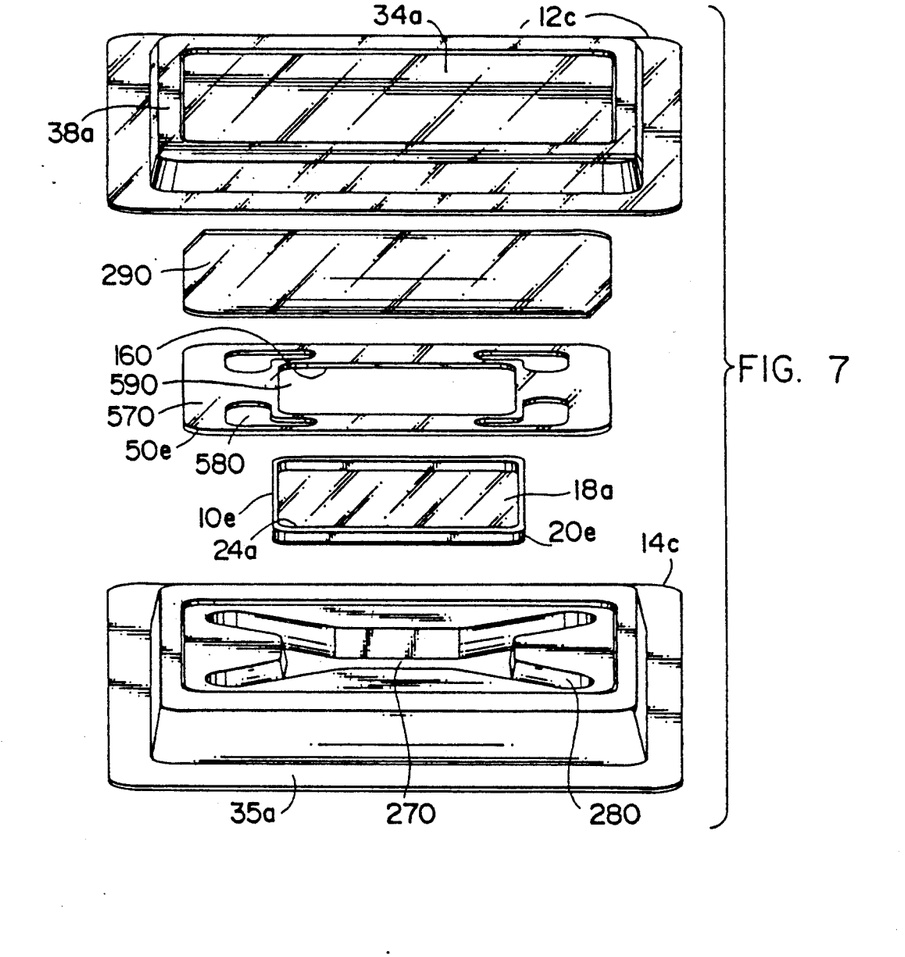
FIG. 7 is a perspective, partly exploded view of a pellicle packaging and handling system according to another embodiment of the present invention with a peel-to-release pellicle holder.
Figure 7A:
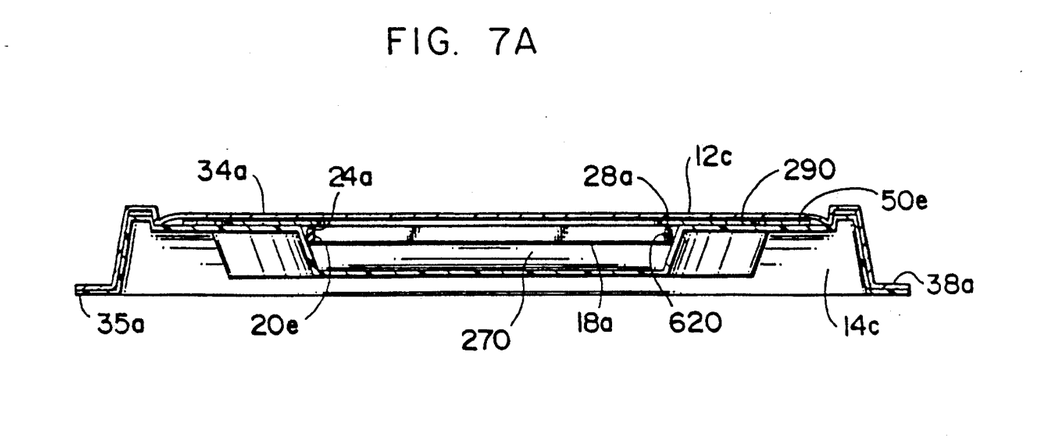
FIG. 7A is a cross-sectional view showing details of the pellicle packaging means of the system shown in FIG. 7.
Figure 8:
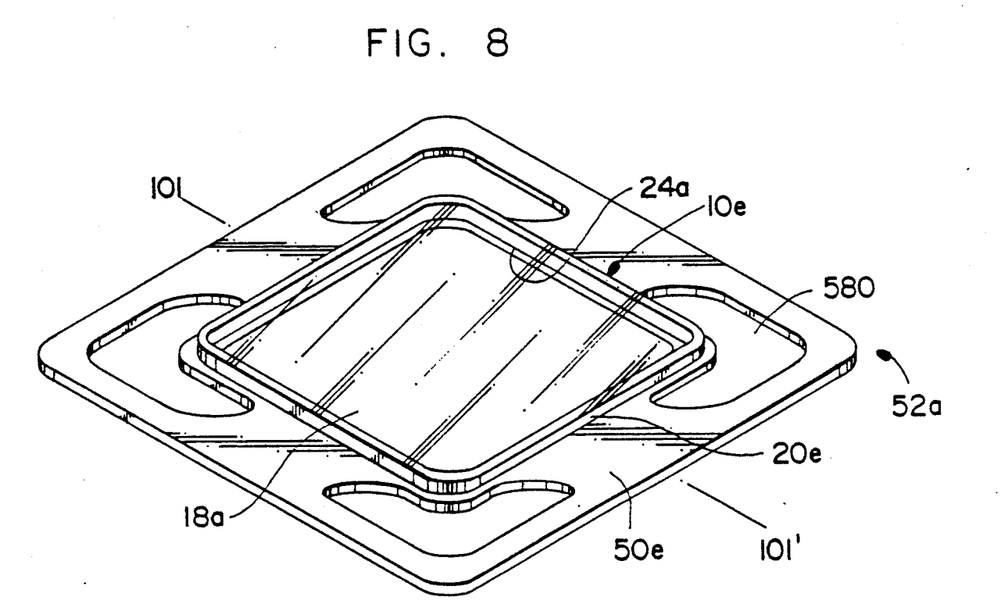
FIG. 8 is a perspective view of a holder/ pellicle assembly according to the present invention with the peel-to-release pellicle holder of FIG. 7.
Figure 8A:
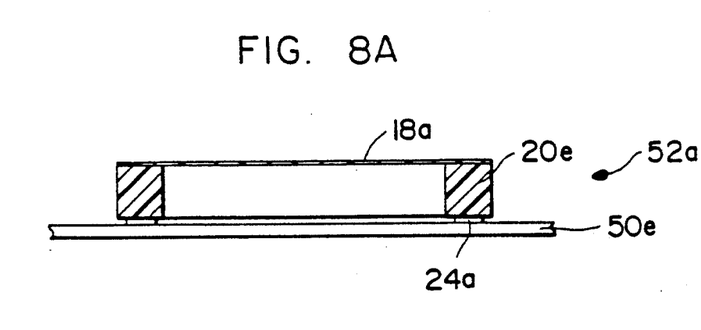
FIG. 8A is a cross-sectional view of the holder/pellicle assembly of FIG. 8 taken along line 101—101'.

FIGS. 7–8A illustrate another embodiment of a pellicle packaging and handling system according to the present invention. This embodiment includes a pellicle holder 50e having a contact ledge 160 that is peelably adhered to the sealing edge 24a on the bottom of the pellicle frame 20e.

The pellicle holder 50e should be flexible enough to peel away from sealing edge 24a yet rigid enough to support pellicle 10e during inspection of the pellicle film 18a and while moving the holder/pellicle assembly 52a to and from box bottom 14c without touching the pellicle 10e. Suitable materials for pellicle holder 50e are non-outgassing and non-particulating in order to avoid contamination of pellicle film 18a. Preferred materials are polyethylene, Teflon®, polycarbonate and polystyrene, having a thickness of about 0.05 to about 0.1 inch, more preferably about 0.07 to about 0.09 inch. Typically the desired material is obtained in flexible sheets of the desired thickness. Pellicle holder 50e including finger grasps 580 and inspection aperture 590 can be produced by a variety of means from the flexible sheets. These means include stamping, laser cutting, die cutting, machining, vacuum forming, injection molding and the like.

Contact ledge 160 of holder 50e is peelably adhered to the sealing edge 24a of pellicle frame 20e. The tactile strength of the adhesive 28a on sealing edge 24a to the contact ledge 160 and any release agent thereon should be about 5 to about 80 ounces per inch. Below about 5 ounces per inch, the sealing edge does not adhere to the contact ledge. Above about 80 ounces per inch the contact ledge cannot be peeled away from the sealing edge. When a release agent is needed on the contact ledge, any non-outgassing non-particulating release agent may be used. A preferred release agent is silicone.

To protect the interior of pellicle 10e, a peelable cover sheet 290 may be adhered to the back surface 570 of pellicle holder 50e. The cover sheet 290 should be more flexible than holder 50e such that the cover sheet bends preferentially to the holder and the cover sheet peels off the holder without deforming or bending the holder. Additionally, the cover sheet material should be strong enough to peel off the holder in one piece to avoid contamination of the interior of the pellicle 10e. Materials suitable for the cover sheet include polyester, polystyrene, polyethylene, polyvinyl chloride and polycarbonate. A sheet having a thickness of about 1–10 mils is preferred, and about 7–7.5 mils is particularly preferred.

A variety of means are suitable for peelably adhering the cover sheet 290 to the back surface 570 of the pellicle holder 50e. For example, a non-outgassing, non-particulating adhesive having tactile strength of about 5 to about 80 ounces of adhesion per inch may be used. Preferred adhesives are Norwood No. 8031 and Mactac 2100. The adhesive may be applied to either the surface of cover sheet 290 or back surface 570 of pellicle holder 50e. If adhesive is applied to the surface of cover sheet 290, it may advantageously be applied over the entire surface of the cover sheet. Then, particles trapped within the interior of pellicle 10e can be captured and retained by the exposed adhesive surface if such particles come into contact with the adhesive surface.

A release agent may be desired for the surface, either the cover sheet surface or the holder back surface, which does not have adhesive thereon. Any non-outgassing, non-particulating release agent such as silicone may be used.

The embodiment of a pellicle packaging and handling system according to the present invention which is shown in FIGS. 7 and 7A includes a pellicle package or box formed by a box top member 12c and a box bottom member 14c. This pellicle package or box houses the pellicle/holder assembly 52a with the pellicle 10e being fixed in position. Box bottom member 14c includes a cavity 270 designed to cooperate with the pellicle/holder assembly 52a to maintain the pellicle 10e in a fixed position. The cavity 270 is designed such that there is minimum contact between the pellicle frame 20e and the box bottom as shown in FIG. 7A. Minimum contact between the box bottom and the pellicle frame can be achieved using contact points 620 on the walls of the cavity. As the pellicle is placed in the cavity film first, the contact points and the pellicle frame meet thereby stopping the pellicle from advancing further into the cavity. Additionally, the contact points maintain the pellicle in a fixed position in the cavity by exerting tangential forces on the pellicle frame at the point of contact. For a round pellicle frame, minimum contact requires at least three contact points on the cavity walls. For a square or rectangular pellicle frame, minimum contact requires at least four contact points.

The box bottom member 14c further includes grasp clearances 280 corresponding to finger grasps 580 in holder 50e. The grasp clearances and finger grasps should provide adequate space for fingers or mechanical means to releasably grip and lift the pellicle holder, with the peelably adhered pellicle thereon, away from the box bottom member. The finger grasps are preferably located in positions in the holder such that nothing reaches across the pellicle film when, gripping, lifting or moving the pellice/holder assembly. FIGS. 7 and 8 depict one possible configuration. In FIGS. 7 and 8 L-shaped finger grasps 580 are aligned with the corners of the contact ledge 160. For round pellicle frames, the finger grasps may be kidney-shaped. The pellicle/holder assembly can then be carried by putting a finger in two adjacent finger grasps, and compressing the holder area which is between the grasps. Mechanical devices such as robotic digits can be used in place of fingers. In this way, the contamination of the pellicle film is avoided by lifting and moving the pellicle/holder assembly without reaching over the film.

A box top member 12c, together with the box bottom member 14c, form an enclosure that houses holder/pellicle assembly 52a. Box top member 12c includes a body portion 34a for covering pellicle 10e, and an outwardly extending lip 38a round the periphery of the pellicle body portion 34a. Preferably, the region of body portion 34a which lies above the holder/pellicle assembly in the final assembly is bowed as shown in FIG. 7A.

The box top member 12c may be hinged or unhinged to the box bottom member 14c. Preferred are a living hinge or no hinge. If the members are unhinged a peripheral sealing zone may be included on extending lip 38a. This sealing zone may be peelably adhered to the peripheral flange 35a of box bottom member 14c to enclose and hermetically seal the pellicle 10e within the pellicle cover 12c and the box bottom member 14c. Alternatively, a mechanical seal formed by mating parts on the box top and bottom members may join the two parts. For example, the box top sidewalls may include a bump and the box bottom sidewalls may have a corresponding indentation or dimple.

The present invention provides a pellicle holder that permits the user to remove a pellicle from its packaging without touching the pellicle frame or using secondary means to hold the pellicle. The pellicle holder also provides means for holding the pellicle during inspection, and is easily graspable so as to reduce the risk of dropping and contaminating or damaging the pellicle.

Since many modifications, variations and changes in detail may be made to the described embodiment, it is intended that all matter in the foregoing description and shown in the accompanying drawings be interpreted as illustrative and not in limiting sense.

What is claimed is:

1. A pellicle packaging and handling system comprising:
   (a) a pattern mask pellicle including a transparent pellicle film extending across a peripheral pellicle frame;
   (b) a pellicle holder including means for releasably attaching the pellicle frame to form a holder/pellicle assembly, the pellicle holder further including means for grasping and handling the holder/ pellicle assembly such that the pellicle film, can be inspected with transmitted light and for releasing the pellicle from the holder;
   (c) a selectively openable enclosure for housing the holder/pellicle assembly; and
   (d) means for releasably retaining the holder/pellicle assembly in a fixed position within the enclosure.

2. The pellicle packaging and handling system of claim 1 wherein the pellicle frame includes a groove extending around the outer perimeter of the pellicle frame, which groove releasably engages the pellicle holder.

3. The pellicle packaging and handling system of claim 1 wherein the pellicle is angular with corners, and wherein the means for complementarily engaging the frame with the pellicle holder include grooves within corners of the pellicle frame.

4. The pellicle packaging and handling system of claim 1 wherein the pellicle holder includes opposed pivotable arms that extend at least part way around the pellicle frame.

5. The pellicle packaging and handling system of claim 4 wherein the means for releasably attaching the pellicle frame include a plurality of tabs that extend inwardly from the pivotable arms and engage a corresponding groove in the pellicle frame.

6. The pellicle packaging and handling system claim 1 wherein the pellicle holder includes an inspection aperture which is substantially aligned with and approximately the size of the inner dimension of the pellicle frame.

7. The pellicle packaging and handling system of claim 6 wherein the means for releasably attaching the pellicle frame includes an adhesive between the surfaces of the pellicle frame and the pellicle holder.

8. The pellicle packaging and handling system of claim 1 wherein the means for grasping and handling the holder/pellicle assembly is comprised of finger grip means.

9. The pellicle packaging and handling system of claim 1 wherein the means for retaining the pellicle holder assembly in a fixed position within the enclosure include means for preventing rotation of the pellicle holder within the enclosure.

10. The pellicle packaging and handling system of claim 1 wherein the means for retaining the holder/pellicle assembly in a fixed position within the enclosure includes a cavity having at least three pellicle frame contact points on the walls thereof.

11. The pellicle packaging and handling system of claim 1 wherein the means for retaining the holder/pellicle assembly in fixed position within the enclosure include first land members on one side of the enclosure and corresponding second land members on the opposing side of the enclosure between which land members the pellicle holder is held, and pins that extend from at least said first land members and through corresponding openings in the pellicle holder.

12. The pellicle packaging and handling system, of claim 1 wherein the pellicle frame has a continuous sealing edge around the bottom portion thereof and the package bottom plate has a contact surface that is peelably adhered to the sealing edge around the bottom of the pellicle frame to hermetically seal the interior of the pellicle.

13. The pellicle packaging and handling system of claim 12 wherein said contact surface is on a raised stage portion of the enclosure.

14. The pellicle packaging and handling system of claim 13 wherein the means for retaining the holder/pellicle assembly in a fixed position within the enclosure includes a holder-seating member for pressing against the pellicle holder within the enclosure.

15. The pellicle packaging and handling system of claim 1 wherein the pellicle holder is a squeeze-to-grip pellicle holder.

16. The pellicle packaging and handling system of claim wherein the pellicle holder comprises contact tabs which engage the pellicle frame to attach the frame to the holder and further comprises two release grips extending from a common point, the ends of the grips furthest from the common point being separated a distance from each other when the pellicle is releasably attached to the holder, the pellicle being released by exerting a force on each grip in the direction of he other grip such that the ends of the grips move toward each other reducing the distance between the ends and disengaging the contact tabs from the pellicle frame.

17. The pellicle packaging and handling system of claim 1 further including adhesive means within the enclosure for capturing and retaining contaminating particles within the enclosure.

* * * * *